United States Patent [19]

Tokumatsu

[11] 4,351,000
[45] Sep. 21, 1982

[54] CLOCK GENERATOR IN PCM SIGNAL REPRODUCING APPARATUS

[75] Inventor: Hiromu Tokumatsu, Osaka, Japan

[73] Assignee: Sanyo Electric Co., Ltd., Moriguchi, Japan

[21] Appl. No.: 214,873

[22] Filed: Dec. 10, 1980

[30] Foreign Application Priority Data

Dec. 14, 1979 [JP] Japan .................... 54-173825[U]

[51] Int. Cl.³ .................. H03B 3/04; H04N 5/05; H04N 5/78
[52] U.S. Cl. .................. 358/158; 360/36; 375/120
[58] Field of Search .......... 328/133, 139; 331/1 A, 331/25; 329/50; 358/148, 153, 154, 158; 375/106, 120; 360/36, 51, 71

[56] References Cited

U.S. PATENT DOCUMENTS 4,203,076 5/1980 Yamishita .................. 360/36
4,253,116 2/1981 Rodgers .................. 358/158

Primary Examiner—Benedict V. Safourek

Attorney, Agent, or Firm—Armstrong, Nikaido, Marmelstein & Kubovcik

[57] ABSTRACT

A PCM signal reproducing apparatus processes PCM audio signals including vertical synchronizing signals and horizontal synchronizing signals for reproducing purposes. The oscillation output of a voltage controlled oscillator is frequency divided in synchronism with the horizontal synchronizing signals to develop clock signals. A frequency divider circuit is provided to frequency divide the clock signals and develop signals to be compared. While the clock signals or its frequency divided signals being counted, narrower pulses whose width is shorter than the interval of the vertical synchronizing signals and broader pulses whose width is longer than the interval of the vertical synchronizing signals are generated. An OR gate receives as its inputs the vertical synchronizing signals and the narrower pulses, while an AND gate receives as its inputs the output of the OR gate and the broader pulses. The output of the AND gate is supplied as a reference input to a phase comparator which in turn compares the reference input and the signals to be compared obtained from the frequency divider circuit and then controls the voltage controlled oscillator.

10 Claims, 3 Drawing Figures

CLOCK GENERATOR IN PCM SIGNAL REPRODUCING APPARATUS

BACKGROUND OF THE INVENTION

1. Field of the Invention

The present invention relates to a PCM signal reproducing apparatus. More specifically, the present invention relates to a circuit for generating clock signals of a frequency corresponding to the interval of vertical synchronizing signals in a video tape recorder or the like.

2. Description of the Prior Art

It is well known in the art of video tape recorders, for example, that synchronizing signal components of video signals and PCM'ed audio signals are recorded on a video track on a magnetic tape and the PCM'ed audio signals are reproduced whenever desired. Such PCM reproduction demands clock pulses in order to process the PCM'ed data and obtain audio signals. The thus reproduced PCM signals, however, generally include components whose time axis varies with variations in number of revolutions of a rotary head. Reproduction of those PCM signals thus requires clock pulses the frequency of which is variable depending upon variations in number of revolutions of the rotary head rather than clock pulses of a fixed frequency. One well-known technique for generating these frequency-variable clock pulses is the use of a phase locked loop including a voltage controlled oscillator whose oscillation frequency is varied depending upon variations in the interval of the vertical synchronizing signals. For instance, attachment of any foreign object to a surface of a magnetic tape results in dropout of any of the vertical synchronizing signals which are to be a reference signal for the phase locked loop. In the event that there is such a loss of one or more discrete vertical synchronizing signals in the prior art apparatus, the phase locked loop receiving these vertical synchronizing signals as the reference signals would be placed into unlocked state, making it impossible to reproduce the PCM data. A conventional approach to compensate for such dropout of the vertical synchronizing signals is to generate pseudo synchronizing signals which in turn prevent the phase locked loop from being placed unlocked state due to such dropout. However, such dropout takes place at a period of time where the PCM audio signals are recorded or interposed. Should any dropout take place at a PCM signal multiplexing period, such dropout would be developed from the output of a vertical synchronizing separator circuit including an integration circuit and supplied as the reference input to the phase locked loop. It has been confirmed by the results of the inventor's experiments that any dropout at the PCM multiplexing period also may place the phase lock loop into unlocked state, thus disturbing the clock pulses. No approach has been suggested so far to overcome variations in the clock pulses originating from such dropout at the PCM signal interval.

SUMMARY OF THE INVENTION

According to the present invention, there is developed a first signal of a period corresponding to the period of synchronizing signals included in PCM signals. The first signal effectively prevents clock pulses from being disturbed due to any dropout occurring at a PCM signal (data) interval. That is, the first signal permits the synchronizing signals to be supplied as a reference signal to a phase locked loop during only a very short period of the interval of the synchronizing signals. The present invention provides a new PCM reproducing device which is free from disturbance of the clock pulses necessary for reproduction of PCM data even when there is any dropout at the PCM signal interval.

In a preferred embodiment of the present invention, a second signal of a period corresponding to the period of the synchronizing signals is developed and either the synchronizing signals reproduced or the second signal is applied to the reference input to the phase locked loop in the form of a logical sum. In the preferred embodiment, the reference input to the phase locked loop is effectively compensated when there is any dropout during the interval of the synchronizing signals.

Accordingly, it is a principal object of the present invention to provide an improved PCM reproducing device.

It is another object of the present invention to provide a clock generator circuit in a PCM reproducing device which is free from disturbance of clock pulses resulting from dropout at a PCM signal interval.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
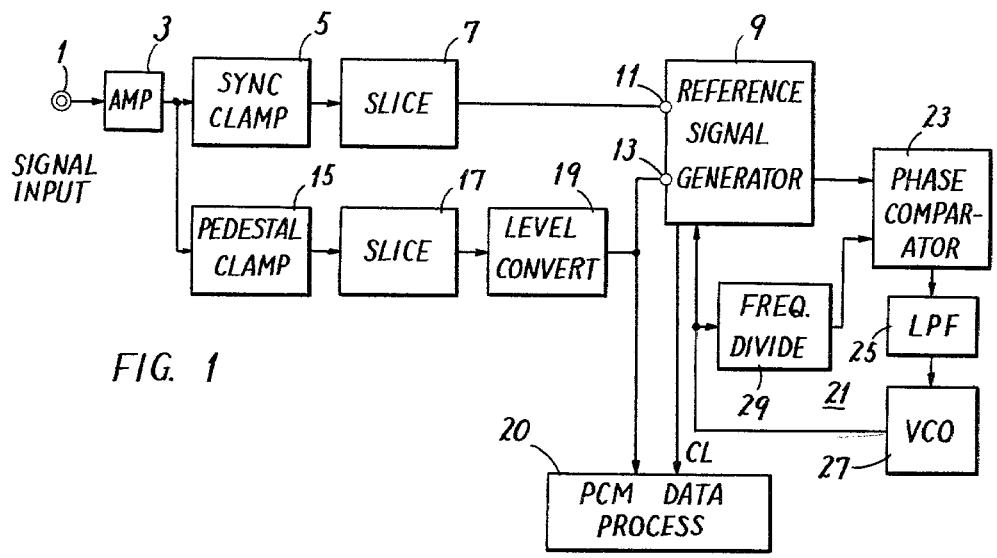
FIG. 1 is a schematic block diagram showing an embodiment of the present invention.

FIG. 1 is a schematic block diagram showing an embodiment of the present invention. Referring to FIG. 1, an input signal from a particular video track on a magnetic tape carrying a PCM record for video tape recorder application is introduced via an input terminal 1. Having been amplified through an amplifier 3, the input signal is fed to a synchronous clamp circuit 5 and a pedestal clamp circuit 15. The output of the synchronous clamp circuit 5 and the output of the pedestal clamp circuit 15 are sliced at given levels with its corresponding slice circuits 7 and 17. The output of the slice circuit 17 is fed as PCM data to a level converter 19 which in turn converts it into a signal of a given level and then to a PCM data processor 20. The respective outputs of the slice circuit 7 and the level converter 19 are applied to input terminals 11 and 13 of a reference signal generator 9. As is clearly described with respect to FIG. 2, the reference signal generator 9 provides a reference input for a phase comparator 23 constituting a phase locked loop 21 in response to the synchronizing signals from the slice circuit 7 especially vertical synchronizing signals and horizontal synchronizing signals. Another input to the phase comparator 23 or a signal to be comapred is supplied from a frequency divider 29. The phase comparator 23 compares the phases of its two inputs and delivers a pulse signal of a width corresponding to the phase difference. This pulse signal is converted via a low-pass filter 25 into a direct current voltage which in turn is supplied as a control voltage to a voltage controlled oscillator 27. The voltage controlled oscillator 27 varies in its oscillation frequency according to the direct current voltage applied thereto, with its oscillation output being applied to the frequency divider 29 and the reference signal generator 9 further provides clock pulse CL for reproduction of the PCM data. The PCM data processor 20 processes the PCM data coming from the level converter 19 in synchronism with the clock pulses CL, thus reproducing audio signals, for example.

Figure 2:
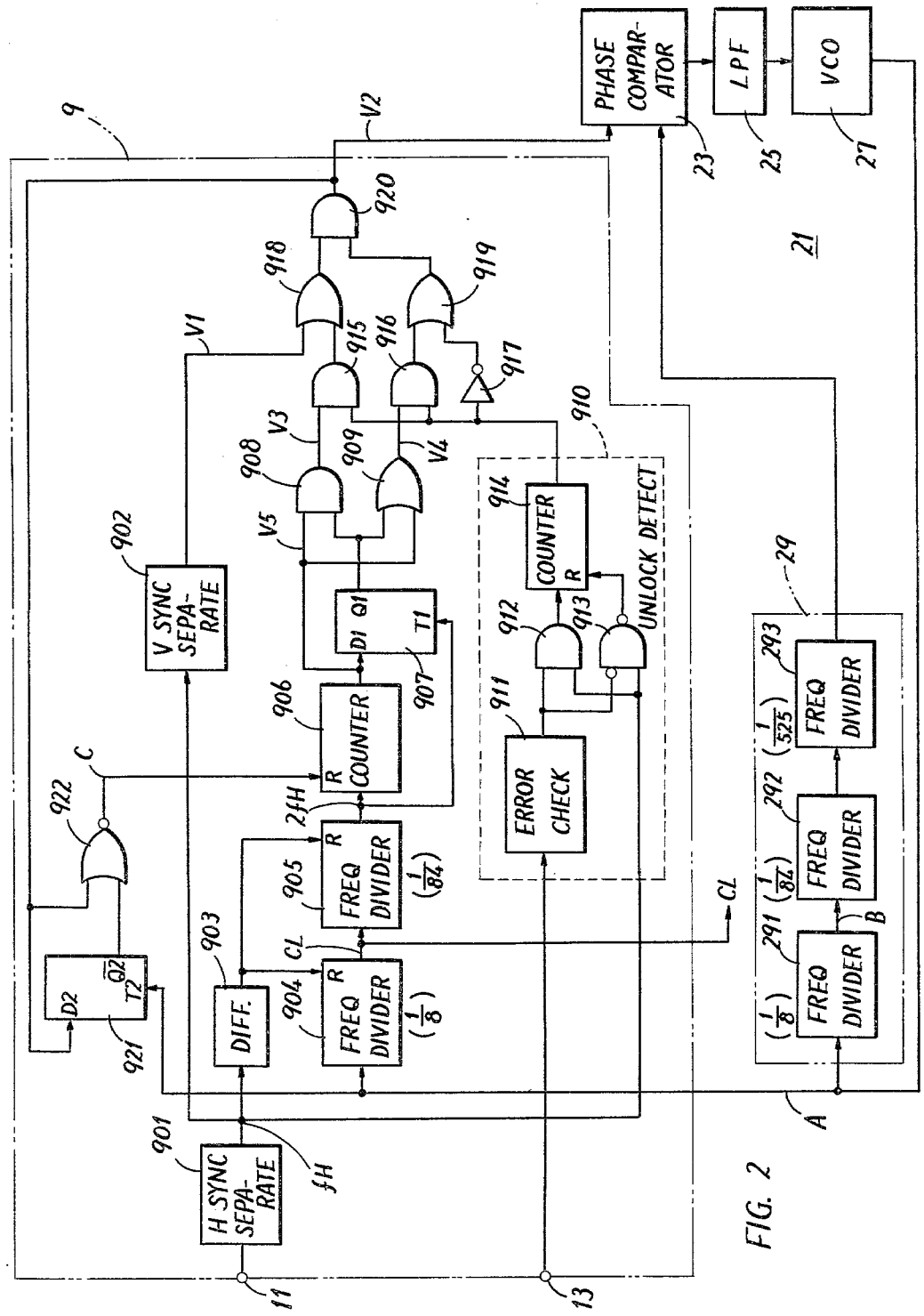
FIG. 2 is a block diagram showing details of a major portion of the FIG. 1 embodiment of the present invention.

FIG. 2 is a block diagram of an embodiment of the present invention, especially illustrating details of the reference signal generator 9. Referring to FIG. 2, the reference signal generator 9 includes a horizontal synchronizing separator circuit 901 which accepts the output of the slice circuit 7 applied via an input terminal 11. The horizontal synchronizing signals of frequency fH are delivered from the horizontal synchronizing separator circuit 901. The output fH of the horizontal synchronizing separator circuit 901 is then applied to a vertical synchronizing separator circuit 902 whose output is applied as vertical synchronizing signals V1 to one input to an OR gate 918 to be described below. Furthermore, the output of the horizontal synchronizing separator circuit 901 is supplied to a differentiation circuit 903 which differentiates the trailing edge of the horizontal synchronizing signals to develop a reset pulse. The reset pulse from the differentiation circuit 903 is fed to a pair of frequency dividers 904 and 905. The frequency divider 904 receives the oscillation output A of the voltage controlled oscillator 27 constituting the phase locked loop 21 and frequency divides the same at a division ratio of ½, developing the clock pulses CL for reproduction of the PCM data. The output of the frequency divider 904 or the clock pulses CL are fed to the frequency divider 905 which frequency divides the same at a division ratio of 1/84. The output of the frequency divider 905 is therefore a signal 2fH whose frequency is twice as high as that of the horizontal synchronizing signals fH. The resulting output 2fH of the frequency divider 905 is applied to a counter 906 and to a clock input T1 of a D type flip-flop 907. The counter 906 provides its output V5 assuming a high level when its count is between "519" and "525". The output V5 is fed to a data input D1 of the D type flip-flop 907, providing a basis for pseudo vertical synchronizing signals V3. The pseudo vertical synchronizing signals V3 compensates against dropout of any vertical synchronizing signal V1 from the vertical synchronizing separator circuit 902 or other defective state. The signal V5 from the counter 906 is further applied to one input to an AND gate 908 and one input to an OR gate 909. The other inputs to the AND gate 908 and the OR gate 909 are supplied with the output Q1 of the D type flip-flop 907. It is noted that the D type flip-flop 907 forms a delay device and delivers the output Q1 which is ½ H behind the signal V5 from the counter 906.

On the other hand, the PCM data supplied via an input terminal 13 of the reference signal generator 9 from the level converter 19 are fed to an error check circuit 911 in an unlocked state detector 910.

The error check circuit 911 includes, for example, a CRC (Cyclic Redundancy Check) scheme and provides a high level output whenever an error occurs in the PCM data reproduced. The output of the error check detector 911 is applied to one input to an AND gate 912 and after inversion is applied to one input to a NAND gate 913. The other inputs to the AND gate 912 and the NAND gate 913 are the horizontal synchronizing signals fH obtained from the horizontal synchronizing separator circuit 901. The output of the AND gate 912 is supplied to a counter 914, while the output of the NAND gate 913 is supplied to a reset input to the counter 914. Within the unlocked state detector 910, the counter 914 serves to count the number of successive errors occurring in the PCM data. If the number of such successive errors as counted by the counter 914 exceeds a predetermined value, then there is provided a low level signal indicating that the phase locked loop 21 is in unlocked state. The unlocked state detector 910 may be built up by a lock state detector as disclosed in U.S. Pat. No. 4,201,945, for example.

Figure 3:
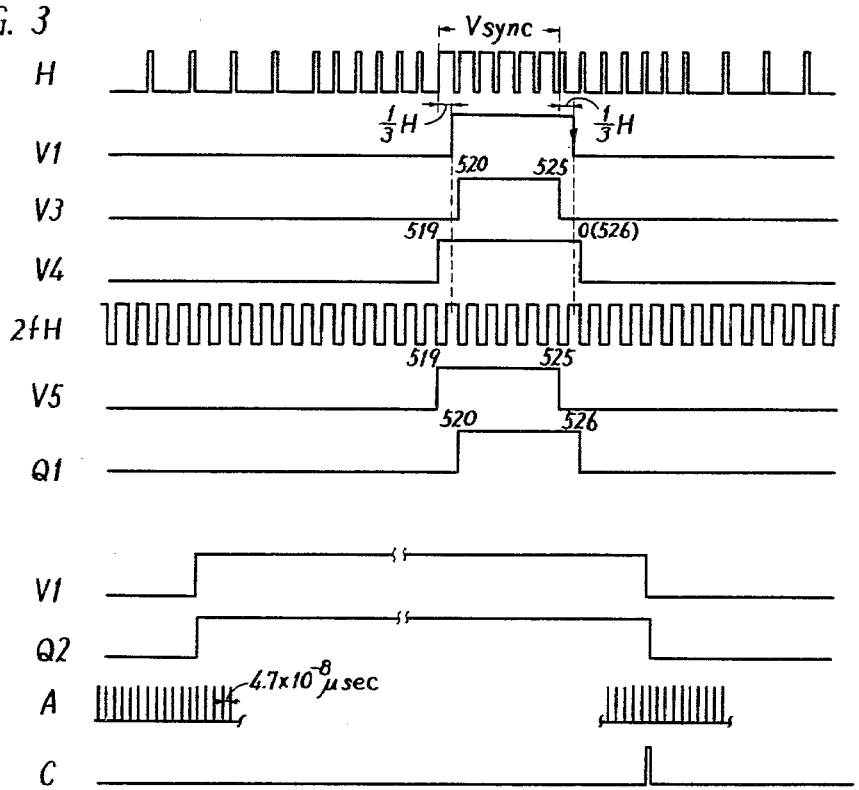
FIG. 3 is a timing chart for explanation of operation of the circuit of FIG. 2.

The output of the unlocked state detector 910 is applied to one input to each of two AND gates 915 and 916 and to an input to an OR gate 919 via an inverter 917. The other input to the AND gate 915 comprises a signal V3 from the AND gate 916, whereas the other input to the AND gate 916 comprises a signal V4 from the OR gate 904. The output of the AND gate 908, as indicated in FIG. 3, establishes a second signal having a width narrower than the normal signal V1 which is separated through the vertical synchronizing separator circuit 902. The output V4 of the OR gate 909, on the other hand, establishes a first signal having a width broader than that of the signal V1 as seen from FIG. 3. The AND gate 915 provides the signal V3 when the output of the unlocked state detector 910 is at a high level i.e. when the phase locked loop 21 is in locked state. With the phase locked loop 21 in locked state, then the AND gate 916 provides the signal V4. The second signal V3 is transferred from the AND gate 915 to the other input to the OR gate 918 and the first signal V4 from the AND gate 916 to the other input to the OR gate 919. The outputs of the two OR gates 918 and 919 are fed as inputs to an AND gate 920. The output V2 of the AND gate 920 is supplied as the reference signal to the phase comparator 23 and also to a data input D2 of a type flip-flop 921 which receives at its clock input T2 the oscillation output A from the voltage controlled osillator 23 in the phase locked loop 21. The inverted output $\overline{Q2}$ of the D type flip-flop 921 is supplied to an input of a NOR gate 922 together with the above described signal V2 from the AND gate 920. The NOR gate 922 provides an output signal C which has a pulse width (say, 50 nsec) beginning with the trailing edge of the reference signal V2. The signal C is applied to the reset input of the counter 906.

The frequency divider 29 which forms part of the phase locked loop 21 typically includes a cascade connection of three frequency dividers 291, 292 and 293. The frequency divider 291 frequency divides the oscillation output A from the voltage countrolled oscillator 27 at a division ratio of ½, developing a signal B. The succeeding frequency divider 292 frequency divides the signal B at a division ratio of 1/84. The last stage frequency divider 293 frequency divides the output of the frequency divider 292 at a division ratio of 1/525. The output of the frequency divider 29 is substantially similar in period to the normal vertical synchronizing signals and supplied to the phase comparator 23 as the input signal which is to be compared. The following will set forth operation of the embodiment of FIG. 2 by reference to FIG. 3.

Assume now that the reproducing apparatus is in first mode such as the beginning of playback operation of a video tape recorder, for example. During such initial state of the playback operation the phase locked loop 21 has not yet been placed into locked state and the output of the unlocked state detector 910 assumes the low level. Therefore, the output of the inverter 917 is at the high level and brings the AND gate 920 into open position. Under these circumstances the AND gates 915 and 916 are both closed with the low level signal from the unlocked state detector 910. The AND gate 920 therefore gates the signal V1 (FIG. 3) supplied via the OR gate 918 obtained from the vertical synchronizing separator circuit 902 and leads the same to the phase comparator 23 as the reference signal V2.

Thereafter, revolution of the rotary head of the video tape recorder (not shown) becomes stable. The output of the unlocked state detector 910 thus assumes the high level to initiate second mode. During this second mode the AND gates 915 and 916 are in open position. The output of the inverter 917 assumes the low level. The second signal V4 having the wider pulse width than the signal V1 as shown in FIG. 3 is developed at the output of the OR gate 919 or the one input to the AND gate 920. The second signal V3 having the narrower pulse width than the normal vertical synchronizing signals V1 as shown in FIG. 3 is developed from the AND gate 915. When the vertical synchronizing separator circuit 902 provides the true or normal vertical synchronizing signal V1, the AND gate 920 transfers that signal V1 as the reference signal V2 during the period of the second signal V4.

If no vertical synchronizing signal V1 is provided due to dropout during the second mode, then the pseudo synchronizing signal V3 instead of the signal V1 is supplied via the OR gate 918 and the AND gate 920 as the reference signal V2.

In this manner, the first signal V4 and its associated logic circuits allow the reference signal V2 to be applied to the phase comparator 23 each interval of the normal vertical synchronizing signals. The vertical synchronizing separator circuit 902 includes a low-pass filter, for example, and, if dropout occurs for any reason during the interval where the PCM signals are recorded, provides a signal variable according to variations in the envelope of the reproduced signals due to such dropout. Unless the AND gate 920 is governed by the first signal V4, a signal originating from the separator circuit 902 due to such dropout during the PCM signal interval would be led as the reference signal V2 to the phase comparator 23, thus disturbing the phase locked loop 21. However, according to the present invention, the first signal V4 allows application of the reference signal V2 during only a limited period of time as determined by the interval of the normal synchronizing signals, thus preventing an undesired signal from being supplied as the reference signal V2 to the phase comparator 23 when there is dropout during the PCM signal interval.

It is noted that the above illustrated embodiment requires the signal V5 and its delayed output in order to obtain the first signal V4. However, it is possible to develop the signal V4 through the utilization of an oscillator which provides its output of a phase synchronous with the signal V3. In addition, while in the above embodiment the circuits 904, 905 and 906 are commonly used to develop the signal V5 and the first signal V4, it is obvious that a separate combination of frequency dividers such as the frequency divider 29 or a separate combination of counters may be provided to develop the signal V4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generator for generating clock signal for reproducing PCM signal inclusive of synchronizing signal, comprising:
   synchronizing signal separating means for separating said synchronizing signal from said PCM signal,
   variable-frequency oscillator means,
   first frequency dividing means for frequency dividing an oscillation output signal from said variable-frequency oscillator means,
   phase comparing means for phase comparison between the output of said synchronizing signal separating means and the output of said frequency dividing means,
   oscillation frequency controlling means responsive to the output of said phase comparing means for controlling the oscillation frequency of said variable-frequency oscillator means,
   first signal generating means including first counter means for excuting counting operation in response to the oscillation output of said variable-frequency oscillator means for generating a first signal having at least a period of time corresponding to the interval of said synchronizing signal,
   inhibiting means responsive to said first signal obtained from said first signal generating means for inhibiting the output of said synchronizing signal separating means from being supplied to said phase comparing means, and
   clock signal generating means responsive to the output of said variable-frequency oscillator means for generating said clock signal.

2. A clock generator in accordance with claim 1, which further comprises
   second signal generating means responsive to the output of said variable-frequency oscillator means for generating a second signal having at most a period of time corresponding to the interval of said synchronizing signal, and
   first logical sum means for providing said second signal obtained from said second signal generating means and the synchronizing signal obtained from said synchronizing signal separating means for said inhibiting means in the form of a logical sum thereof.

3. A clock generator in accordance with claim 1 or 2, which further comprises third signal generating means responsive to at least the output of said variable-frequency oscillator means for generating a third signal having a period of time corresponding to the interval of said synchronizing signals obtained from said synchronizing signal separating means, and wherein said first signal generating means generates said first signal in response to said third signal obtained from said third signal generating means.

4. A clock generator in accordance with claim 3, wherein
   said first signal generating means comprises
   delay means for delaying said third signal obtained from said third signal generating means, and second logical sum means for providing a logical sum of said third signal obtained from said third signal generating means and an output signal obtained from said delay means, the output of said second logical sum means being used as said first signal.

5. A clock generator in accordance with claim 3, wherein
said second signal generating means comprises
delay means for delaying said third signal obtained from said third signal generating means, and
logical product means for providing a logical product of said third signal obtained from said third signal generating means and an output signal obtained from said delay means, the output of said logical product means being used as said second signal.

6. A clock generator in accordance with claim 1 or 3, wherein
said PCM signal includes vertical synchronizing signal and horizontal synchronizing signal as said synchronizing signal,
said clock signal generating means includes second frequency dividing means for frequency dividing the output of said variable-frequency oscillator means in synchronism with said horizontal synchronizing signal and generating said clock signal.

7. A clock generator in accordance with claim 6 wherein said third signal generating means comprises second counter means for counting said clock signal obtained from said second frequency dividing means, said second counter means providing its output signal as said third signal until its count value from a first predetermined value to a second predetermined value.

8. A clock generator in accordance with claim 7, which further comprises third frequency dividing means interposed between said second frequency dividing means and said second counter means for frequency dividing said clock signal.

9. A clock generator in accordance with claim 1, wherein said variable-frequency oscillator means, said first frequency dividing means, said phase comparing means and said oscillation frequency controlling means form a phase locked loop, and which further comprises
unlocked state detecting means for deciding if said phase locked loop is in unlocked state, and
releasing means responsive to the output of said unlocked state detecting means for releasing inhibition operation of said inhibiting means.

10. A clock generator in accordance with claim 9, wherein said unlocked state detecting means includes error detector means for detecting data error in said PCM signal.

* * * * *